(12) United States Patent
Mizumura et al.

(10) Patent No.: US 9,152,057 B2
(45) Date of Patent: Oct. 6, 2015

(54) SCANNING EXPOSURE APPARATUS USING MICROLENS ARRAY

(75) Inventors: Michinobu Mizumura, Yokohama (JP); Makoto Hatanaka, Yokohama (JP)

(73) Assignee: V TECHNOLOGY CO., LTD., Yokohama-shi, Kanagawa (JP)

( * ) Notice: Subject to any disclaimer, the term of this patent is extended or adjusted under 35 U.S.C. 154(b) by 266 days.

(21) Appl. No.: 13/880,352

(22) PCT Filed: Sep. 12, 2011

(86) PCT No.: PCT/JP2011/070737
§ 371 (c)(1), (2), (4) Date: Apr. 18, 2013

(87) PCT Pub. No.: WO2012/056817
PCT Pub. Date: May 3, 2012

(65) Prior Publication Data
US 2013/0208255 A1    Aug. 15, 2013

(30) Foreign Application Priority Data
Oct. 29, 2010    (JP) ................................ 2010-244697

(51) Int. Cl.
*G03F 7/20*    (2006.01)

(52) U.S. Cl.
CPC ........ *G03F 7/70258* (2013.01); *G03F 7/70275* (2013.01)

(58) Field of Classification Search
CPC ............ G03F 7/70258; G03F 7/70275; G03F 7/70216; G02B 3/0056
See application file for complete search history.

(56) References Cited

U.S. PATENT DOCUMENTS

| 4,950,862 | A  | * | 8/1990 | Kajikawa ................. 219/121.68 |
| 6,016,185 | A  | * | 1/2000 | Cullman et al. ................. 355/52 |
| 7,932,993 | B2 | * | 4/2011 | Mei ................................ 355/53 |
| 2003/0123040 | A1 |  | 7/2003 | Almogy |

(Continued)

FOREIGN PATENT DOCUMENTS

| JP | 2001-521278 A | 11/2001 |
| JP | 2006-502558 A | 1/2006 |

(Continued)

OTHER PUBLICATIONS

International Search Report in PCT/JP2011/070737 dated Dec. 13, 2011(English Translation Thereof).

*Primary Examiner* — Steven H Whitesell Gordon
(74) *Attorney, Agent, or Firm* — McGinn IP Law Group, PLLC

(57) ABSTRACT

A microlens array is a stacked body of four unit microlens arrays, and the optical axis of a portion of the unit microlens arrays can be shifted from the optical axis of the other unit microlens arrays. In a scanning exposure apparatus, a CCD line camera detects an image on a substrate, and using a first-layer pattern on the substrate as a reference pattern, in a case in which a mask exposure pattern does not match the reference pattern, shifts the optical axis of the microlenses to adjust the magnification of a projection pattern using the microlens array. This makes it possible to adjust the exposure position using the microlens array so that even when the exposure pattern deviates from the reference pattern, the deviation can be detected during exposure and an exposure pattern misregistration can be prevented, enabling the precision of the exposure pattern to be enhanced in an overlay exposure.

5 Claims, 9 Drawing Sheets

(56) References Cited

U.S. PATENT DOCUMENTS

| | | | |
|---|---|---|---|
| 2005/0190353 A1* | 9/2005 | Gui et al. | 355/55 |
| 2005/0200821 A1* | 9/2005 | Gui | 355/67 |
| 2006/0001855 A1* | 1/2006 | Lof et al. | 355/69 |
| 2006/0138358 A1* | 6/2006 | Lof et al. | 250/492.22 |

FOREIGN PATENT DOCUMENTS

| | | |
|---|---|---|
| JP | 2007-003829 A | 1/2007 |
| JP | 2007-052214 A | 3/2007 |
| JP | 2007-279113 A | 10/2007 |

* cited by examiner (a)

(b)

(a)

(b)

SCANNING EXPOSURE APPARATUS USING MICROLENS ARRAY

TECHNICAL FIELD

The present invention relates to a scanning exposure apparatus using a microlens array for exposing a mask pattern on a substrate using a microlens array having microlenses arrayed two-dimensionally therein.

BACKGROUND ART

A prescribed pattern is formed on a thin-film transistor liquid crystal substrate and a color filter substrate or the like by subjecting a resist film formed on a glass substrate to overlay exposure a number of times. The substrates to be subjected to exposure may expand and contract during the film-forming process, and the pitch of the lower layer pattern may differ from the design pitch in the overlay exposure due to fabrication conditions (exposure apparatus characteristics and temperature conditions). In an overlay exposure such as this, when a change in the pitch of the exposure position occurs, the pitch change has to be absorbed by controlling magnification on the exposure apparatus side. That is, in a case where the dimensions for the substrate being subjected to exposure have fluctuated, the image must be arranged in the center of a prescribed position on the substrate having the post-fluctuation pitch by adjusting the image magnification to meet the pitch deviation.

Alternatively, a scanning exposure apparatus using a microlens array having microlenses that are arranged two-dimensionally has been proposed recently (Patent Document 1). In this scanning exposure apparatus, a plurality of microlens arrays is arrayed in one direction, and a substrate and a mask are moved relative to the microlens arrays and an exposure light source in a direction perpendicular to the array direction, thereby causing the exposure light to scan the mask and an exposure pattern formed in a hole in the mask to be imaged on the substrate.

PRIOR ART DOCUMENTS

Patent Documents

Patent Document 1: Japanese Patent Application Kokai Publication No. 2007-003829

DISCLOSURE OF THE INVENTION

Problems the Invention is Intended to Solve

However, a conventional scanning exposure apparatus has the following problems. In an exposure apparatus using projection optics that use a combination of normal lenses, it is easy to adjust the magnification by adjusting the lens spacing or the like. However, in the case of microlenses, it is not possible to adjust the magnification since an erect actual-size image is imaged on a substrate by arranging eight lenses in the direction of the optical axis inside a plate-like microlens array having a thickness, for example, of 4 mm. Consequently, in a scanning exposure apparatus using the microlens array, the problem is that it is not possible to deal with a pitch change in a substrate that is being subjected to exposure.

The present invention was devised with the foregoing problem in view, an object being to provide a scanning exposure apparatus using a microlens array that is capable of using the microlens array to adjust an exposure position. Another object of the present invention is to provide a scanning exposure apparatus using a microlens array, wherein, even when an exposure pattern deviates from a reference pattern, the exposure apparatus using a microlens array is capable of detecting the deviation during exposure and preventing an exposure pattern misregistration, making it possible to enhance the precision of the exposure pattern in an overlay exposure.

Means for Solving the Problem

A scanning exposure apparatus using a microlens array according to the present invention comprises a microlens array being arranged above a substrate to be subjected to exposure and having a plurality of unit microlens arrays arranged by being stacked on top of one another, the unit microlens arrays configured having each of a plurality of microlenses arranged two-dimensionally therein, a mask arranged above the microlens arrays and having a prescribed exposure pattern formed thereon, an exposure light source for irradiating an exposure light on the mask, and a movement member for moving at least a portion of the unit microlens arrays so that the optical axis of the component microlenses thereof is shifted relative to the other unit microlens arrays, wherein the exposure position on the substrate is adjusted using the microlens array by shifting the optical axis of the unit microlens arrays.

In the scanning exposure apparatus using the microlens array, for example, the microlens array is configured from four unit microlens arrays, and is configured to shift the microlens optical axis between the unit microlens arrays of a first layer and a second layer, and the unit microlens arrays of a third layer and a fourth layer. Or, the microlens array is configured from a plurality of unit microlens arrays, and is configured so that the respective microlens optical axes are shifted at a prescribed inverted imaging position between the stacked unit microlens arrays.

In addition, a plurality of the microlens arrays is arranged along the surface of the substrate, and the exposure apparatus further comprises an image detector for detecting the substrate image, an image processor for performing image processing on the basis of the image detection signal to obtain a reference pattern formed on the substrate, and a controller for calculating a deviation between the reference pattern and an exposure pattern for the mask that is to be subjected to exposure, and adjusting, by way of the movement member, the position of the microlens optical axis in each of the microlens arrays to resolve the deviation between the reference pattern and the exposure pattern, and can be configured to adjust the exposure position on the substrate using the plurality of microlens arrays to make the exposure pattern match the reference pattern.

Effects of the Invention

According to the present invention, fundamentally, it is possible to adjust the exposure position in a microlens array for exposing an erect actual-size image, thereby yielding an effect similar to artificially adjusting the magnification. Then, in the exposure apparatus using the microlens array, it is possible to detect a misregistration between a reference pattern and an exposure pattern during exposure by detecting the substrate image during exposure to detect the reference pattern thereof, enabling the misregistration to be resolved by adjusting the tilt angle of the plurality of microlens arrays. Thus, an exposure misregistration is detected and resolved in real-time, thereby enabling the dimensional accuracy of an exposure position to be effectively enhanced in an overlay exposure.

BEST METHOD FOR CARRYING OUT THE INVENTION

Figure 1:
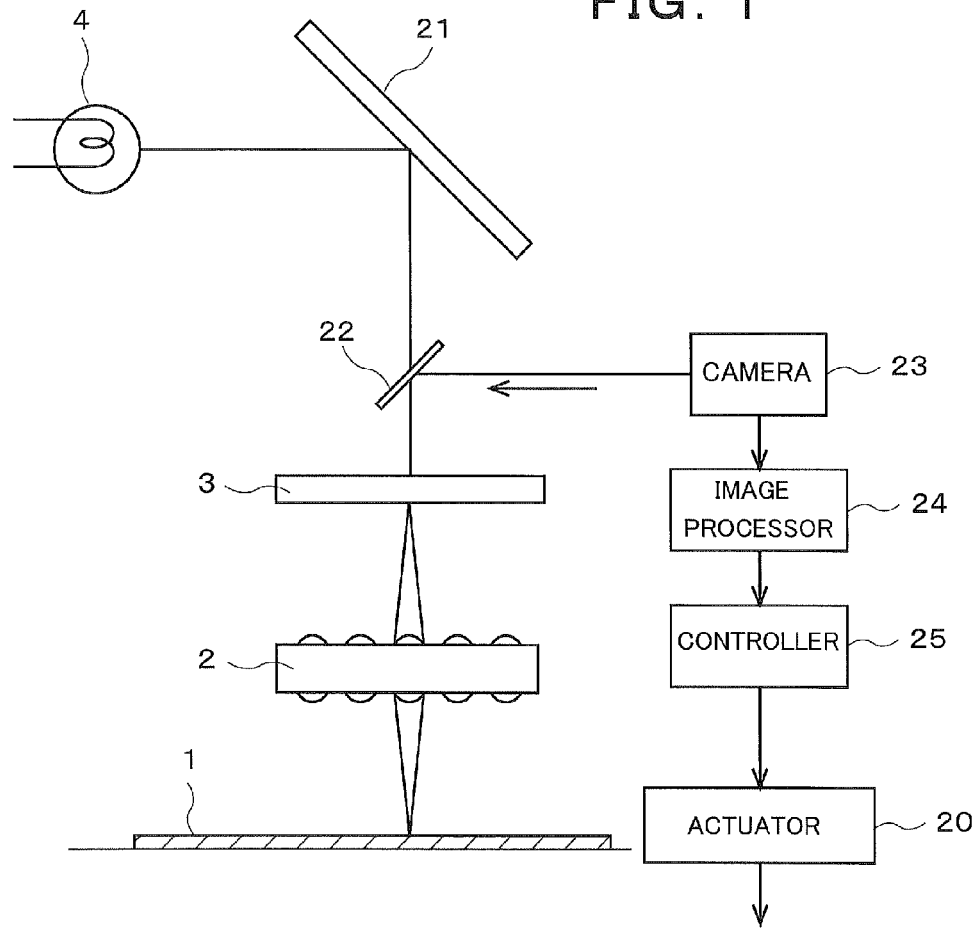
FIG. 1 is a schematic view showing an exposure apparatus according to an embodiment of the present invention.
Figure 2:
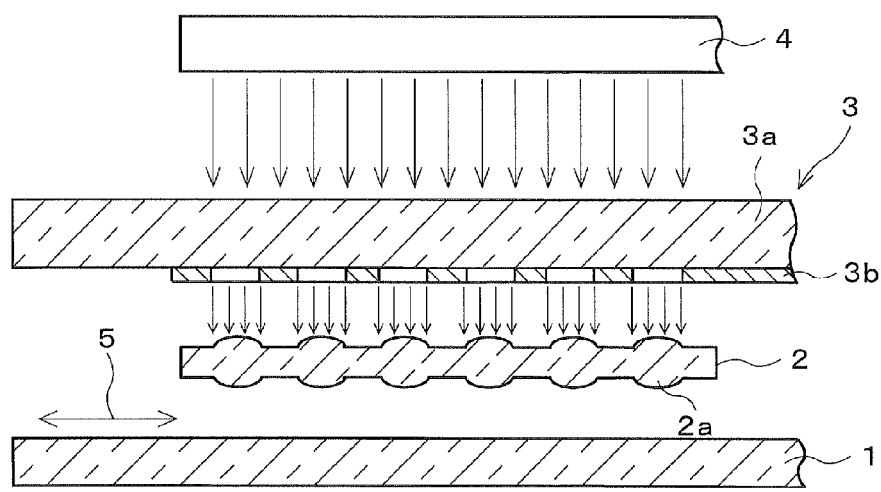
FIG. 2 is a longitudinal cross-sectional view showing a portion of one of the microlens arrays of the exposure apparatus according to an embodiment of the present invention.
Figure 4:
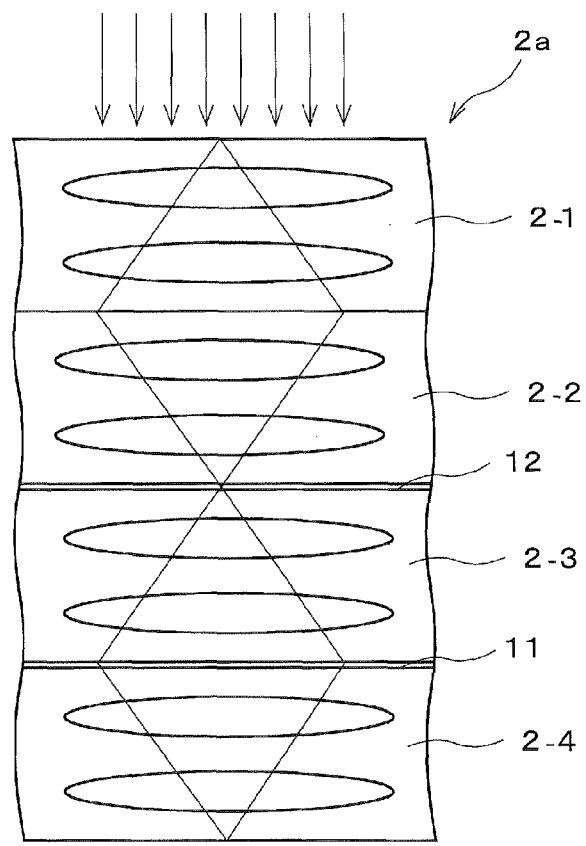
FIG. 4 is a view showing a microlens.
Figure 5:
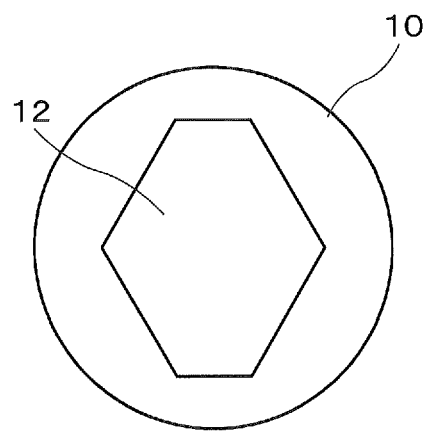
FIGS. 5(a) and 5(b) are views showing stops thereof.
Figure 5:
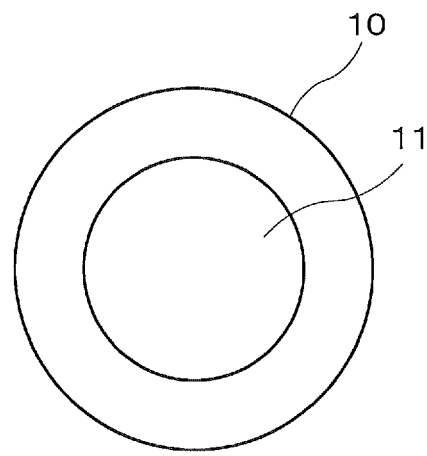
Figure 6:
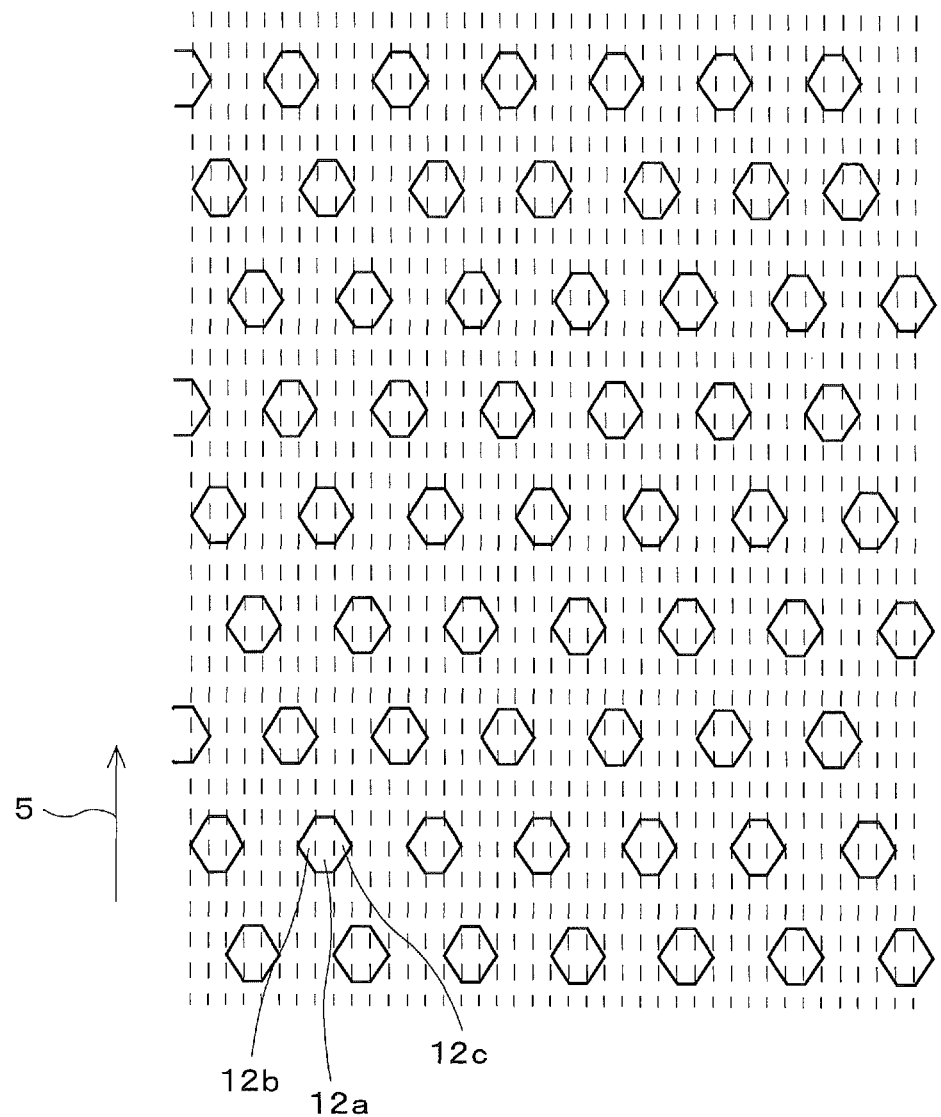
FIG. 6 is a planar view showing an arrangement of microlens hexagonal field stops.
Figure 7:
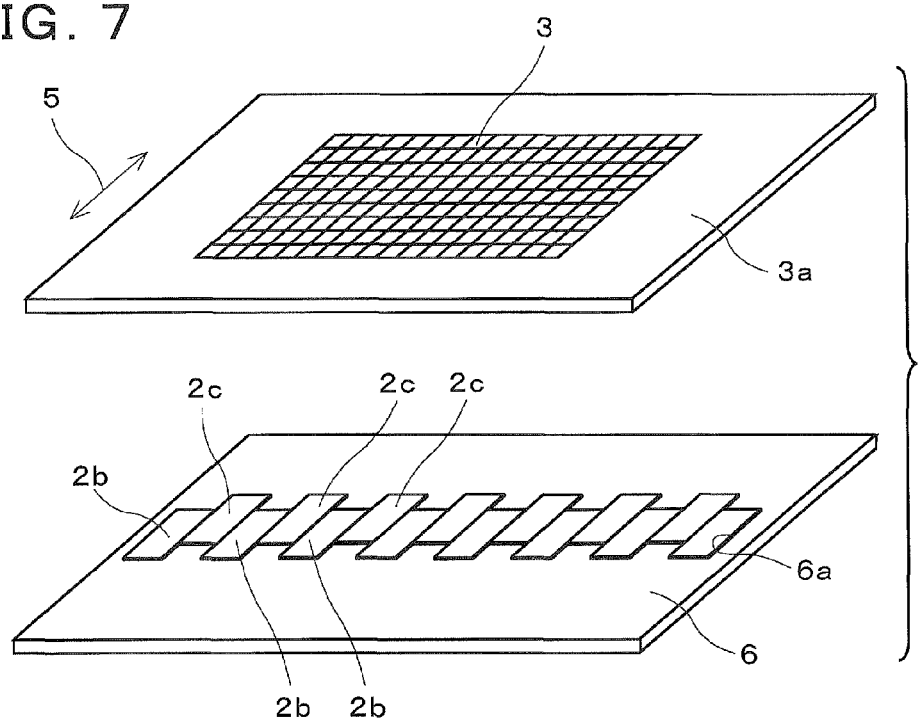
FIG. 7 is a perspective view showing another exposure apparatus wherein a plurality of microlens arrays is arrayed.

Embodiments of the present invention will be described in detail hereinbelow with reference to the attached drawings. FIG. 1 is a schematic view showing an exposure apparatus according to an embodiment of the present invention, FIG. 2 is a longitudinal cross-sectional view showing a portion of one of the microlens arrays thereof, FIG. 3 is oblique perspective view showing a state wherein a plurality of the microlens arrays is arrayed, FIG. 4 is a view showing an optical mechanism of a microlens, FIGS. 5(a) and 5(b) are views showing stops thereof, FIG. 6 is a planar view showing an arrangement of microlens hexagonal field stops, and FIG. 7 is a perspective view showing another exposure apparatus wherein a plurality of microlens arrays is arrayed.

As shown in FIG. 1, an exposure light outputted from an exposure light source 4 is guided to a mask 3 by way of an optical system 21 including a flat mirror, the exposure light that is transmitted through the mask 3 is irradiated 9 on a microlens array 2, and a pattern formed in the mask 3 is imaged on a substrate 1 using the microlens array 2. A dichroic mirror 22 is arranged in the light path of the optical system 21, an observation light from a camera 23 is reflected by the dichroic mirror 22 toward the mask 3 coaxially with the exposure light from the exposure light source 4. The observation light is made to converge on the substrate 1 by the microlens array 2 and reflect a reference pattern already formed on the substrate 1, and the reflected light of the reference pattern is made incident on the camera 23 by way of the microlens array 2, the mask 3, and the dichroic mirror 22. The camera 23 detects the reflected light of the reference pattern, and outputs a detection signal thereof to an image processor 24. The image processor 24 subjects the reference pattern detection signal to image processing to obtain a reference pattern detection image. A reference pattern image signal obtained by the image processor 24 is inputted to a controller 25, the controller 25 calculates a deviation between the current position of the mask 3 (that is, the position in the mask 3 of the exposure pattern to be subjected to exposure) and the position of the detected reference pattern, and calculates an exposure correction amount for the microlens array 2 in order to resolve the deviation. Then, the controller 25 outputs a signal corresponding to the exposure correction amount for the microlens array 2 to an actuator 20 serving as the movement member for moving the unit microlens arrays of the microlens array 2, and the actuator 20 shiftingly drives the optical axis of the microlens 2a in the microlens array 2 on the basis of this signal. The substrate 1 and the mask 3 can be integrally moved in a fixed direction, and the microlens array 2, the exposure light source 4, and the optical system 21 are fixedly arranged. Then, the exposure light is scanned onto the substrate by moving the substrate 1 and the mask 3 in one direction, and in the case of a so-called one-piece substrate wherein a single substrate, for liquid crystal display is fabricated from a glass substrate, the entire substrate for liquid crystal display is subjected to exposure using the single scan described hereinabove.

Next, the mode of exposure using the microlens array will be described in more detail. As shown in FIG. 2, the microlens array 2 configured by arranging a plurality of microlenses 2a two-dimensionally is arranged above a glass substrate or other such substrate to be subjected to exposure, and, in addition, the mask 3 is arranged above the microlens array 2, and the exposure light source 4 is arranged above the mask 3. Furthermore, only one microlens array is illustrated in the drawings of FIG. 1 and FIG. 2. A light-blocking film comprising a Cr film 3b is formed on the bottom surface of a transparent substrate 3a of the mask 3, and exposure light is transmitted through a hole formed in the Cr film 3b and is made to converge on the substrate by the microlens array 2. As described hereinabove, in this embodiment, for example, the microlens array 2 and the exposure light source 4 are fixed, and the substrate 1 and the mask 3 are synchronized and move in the direction of arrow 5, whereby the exposure light from the exposure light source 4 is transmitted through the mask 3 and is scanned onto the substrate 1 in the direction of arrow 5. The movement of the substrate 1 and the mask 3 is driven by a drive source in a suitable movement device. Furthermore, the substrate 1 and the mask 3 may be fixed, and the microlens array 2 and the exposure light source 4 may be moved.

Figure 3:
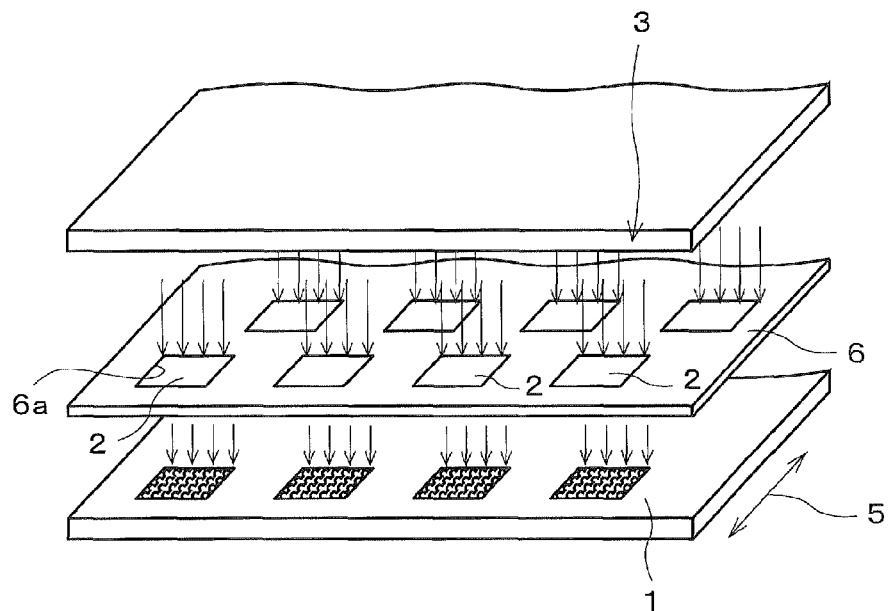
FIG. 3 is a perspective view showing an exposure apparatus wherein a plurality of the microlens arrays is arrayed.

As shown in FIG. 3, the microlens arrays 2 are arranged in a support substrate 6, for example, in two rows of four each in a direction perpendicular to the scanning direction 5, and the microlens arrays 2 are arranged so that the two rows of microlens arrays 2 are staggered with three of the four microlens arrays 2 in the rear being arranged between the four microlens arrays 2 in the front as viewed from the scanning direction 5. In accordance with this, the entire exposure area in the direction perpendicular to the scanning direction 5 is exposed on the substrate 1 using the two rows of microlens arrays 2.

Each microlens array 2 is a laminated body of four unit microlens arrays, and as shown in FIG. 4, for example, has a structure wherein the four unit microlens arrays 2-1, 2-2, 2-3, and 2-4 are stacked on top of one another. Therefore, each microlens 2a of each microlens array 2 is a four-section, eight-lens configuration, and each of the unit microlens arrays 2-1 and so forth is configured from two convex lenses. This allows the exposure light to be made to temporarily converge between the unit microlens array 2-2 and the unit microlens array 2-3, and, in addition, to be imaged on the substrate below the unit microlens array 2-4. Then, a hexagonal field stop 12 is arranged between the unit microlens array 2-2 and the unit microlens array 2-3, and an aperture stop 11 is arranged between the unit microlens array 2-3 and the unit microlens array 2-4. The hexagonal field stop 12 and aperture stop 11 are provided in each microlens 2a, and the exposure area on the substrate is formed into a hexagon with respect to each microlens 2a. The hexagonal field stop 12, as shown in FIG. 5(a), for example, is formed as a hexagonal-shaped aperture in the lens field of view 10 area of the microlens 2a, and the aperture stop 11, as shown in FIG. 5(b), is formed as a circular aperture in the lens field of view 10 area of the microlens 2a.

FIG. 6 is a view for showing a mode of arrangement for each microlens 2a in each microlens array 2, and is a view for showing the mode of arrangement of the microlens 2a as the position of the hexagonal field stop 12 of the microlens 2a. FIG. 6 is a state wherein a shift in the microlens 2a optical axis, which will be explained further below, is not being performed. As shown in FIG. 6, the microlenses 2a are arranged sequentially to deviate slightly in a transverse direction with respect to the scanning direction 5. The hexagonal field stop 12 is divided into a central rectangular portion 12a, and triangular portions 12b and 12c on the two sides as viewed from the scanning direction 5. In FIG. 6, the broken lines are segments for connecting the corners of the hexagons in the hexagonal field stops 12 in the scanning direction 5. As shown in FIG. 6, in relation to each row in the direction perpendicular to the scanning direction 5, the microlenses 2a are arranged so that, when three rows of hexagonal field stops 12 are viewed with respect to the scanning direction 5, the triangular portion 12c on the right side of a certain specified first row of hexagonal field stops 12 overlaps with the triangular portion 12b on the left side of the second row of hexagonal field stops 12 that is adjacent in the rearward scan direction, and the triangular portion 12b on the left side of the first row of hexagonal field stops 12 overlaps with the triangular portion 12c on the right side of a third row of hexagonal field stops 12. In so doing, three rows of microlenses 2a are arranged as a single set in relation to the scanning direction 5. That is, a fourth row of microlenses 2a is arranged in the same position as the first row of microlenses 2a in relation to the direction perpendicular to the scanning direction 5. When the area of the triangular portion 12b and the area of the triangular portion 12c of the hexagonal field stops 12 of two adjacent rows of the three rows of hexagonal field stops 12 are added together at this time, the linear density of the total area of the two triangular portions 12b,12c that overlap in the scanning direction 5 becomes the same as the linear density of the area of the central rectangular portion 12a. Furthermore, the linear density is the aperture area of the hexagonal field stop 12 per unit length in the direction perpendicular to the scanning direction 5. That is, the total area of the triangular portions 12b, 12c constitutes the area of the rectangular portion obtained by regarding the bases of the triangular portions 12b, 12c as the length, and the height of the triangular portions 12b, 12c as the width. Since this rectangular portion is the same length as the length of the rectangular portion 12a, the linear density of the triangular portions 12b, 12c becomes the same as the linear density of the rectangular portion 12a when compared using the aperture area (linear density) per unit length in relation to the direction perpendicular to the scanning direction 5. Thus, when the substrate 1 is subjected to a scan of three rows of microlenses 2a, an exposure light of uniform intensity is received over the entire area in relation to the direction perpendicular to the scanning direction 5. Therefore, integral multiples of three rows of microlenses 2a are arranged in each microlens array 2 in relation to the scanning direction 5, resulting in the substrate being subjected to exposure light of uniform intensity over the entire area using a single scan. In the microlens arrangement shown in FIG. 6, in order to obtain uniform intensity distribution, it is necessary that the rows of microlenses be provided in units of three rows, and that rows having a total of an integral multiple of three microlenses be provided in relation to the scanning direction 5. However, for example, rows of microlenses can also be provided in units of four rows. In this case, the microlenses are arranged so that each of (the right-side triangular portions of the first row and the left-side triangular portions of the second row), (the right-side triangular portions of the second row and the left-side triangular portions of the third row), (the right-side triangular portions of the third row and the left-side triangular portions of the fourth row), and (the right-side triangular portions of the fourth row and the left-side triangular portions of the first row) overlap in the scanning direction 5.

In a microlens array 2 configured in this manner, the substrate 1 is subjected to exposure light of uniform intensity over the entire area targeted for exposure on the substrate 1 in accordance with moving the substrate 1 relative to the microlens array 2 and using the exposure light to scan the substrate while the exposure light from the exposure light source 4 is being irradiated. That is, the substrate 1 is not subjected to spot exposure corresponding to the position of the microlens 2a, but rather the areas between the microlenses 2a of one row are subjected to exposure by the microlenses 2a of another row, and the substrate 1 is subjected to uniform exposure over the entire area targeted for exposure exactly the same as when subjected to planar exposure. The pattern projected onto the substrate 1 is not the shape of the hexagonal field stop 12 and the aperture stop 11 of the microlens 2a, but rather is a pattern determined by a mask pattern (exposure pattern) formed in a hole in the Cr film 3b (light-blocking film) of the mask 3.

As shown in FIG. 7, the microlens array 2 is arranged on a support substrate 6 by being divided into two rows, i.e. microlens array 2b and microlens array 2c, and the microlens array 2b and microlens array 2c are arranged to form rows in the direction perpendicular to the scanning direction 5 and to deviate from one another in the scanning direction 5. The microlens array 2 is arranged by being fitted into a hole 6a provided in the support substrate 6, and each hole 6a is sized to correspond to the external shape of each microlens array 2. The microlens arrays 2 are arranged in a row with respect to a direction orthogonal to the scanning direction 5 so that adjacent microlens arrays 2 (microlens array 2b and microlens array 2c) adjoin one another. The portion of the support substrate 6 between the adjacent microlens arrays 2 in the direction orthogonal to the scanning direction 5 is extremely narrow, and a space between the edge of the microlens array 2 in the direction orthogonal to the scanning direction 5 and the microlens 2a arranged near the edge is shortened to less than half of the array pitch of the microlens 2a. Thus, even when the microlens arrays 2 are lined up in rows in the direction orthogonal to the scanning direction 5, the spaces between the microlenses 2a of all the microlens arrays 2 in the direction orthogonal to the scanning direction 5 can be made the same. That is, the pitch of the microlenses 2a in the direction orthogonal to the scanning direction 5 is fixed for all the microlens arrays 2. A single microlens array 2 is arranged with respect to the scanning direction 5, and the pitch of the microlenses 2a in this microlens array 2 is fixed.

The microlens array 2 can also be arranged in the support substrate 6 to be mutually isolated in both the scanning direction 5 and the direction orthogonal to the scanning direction 5 as shown in FIG. 3. In this case, the microlens arrays 2 can be provided so that the ends thereof overlap when viewed in the scanning direction 5; therefore, the space between the edge and the microlens 2a at the ends of each microlens array 2 in relation to the direction orthogonal to the scanning direction 5 does not need to be reduced to less than half of the pitch of the microlenses 2a, the width at the end of each microlens array 2 can be made sufficiently large. Also, the spacing between the holes 6a in the support substrate 6 in the direction orthogonal to the scanning direction 5 can be made sufficiently wide, without having to adopt the narrow-space arrangement shown in FIG. 7. In FIG. 3 and FIG. 7, the microlens arrays 2 are arranged in a staggered state with respect to the direction orthogonal to the scanning direction 5, but in a case where the microlens arrays 2 adjoin one another as shown in FIG. 7, it is also possible to arrange the microlens arrays 2 in a row in a straight line with the scanning direction 5.

Figure 8:
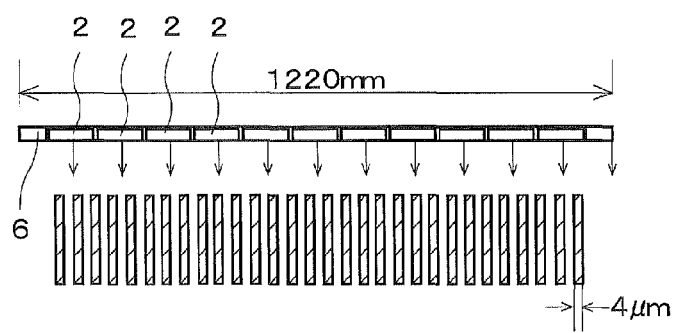
FIG. 8 is a schematic view showing an exposure light projection state using a plurality of microlens arrays.

FIG. 8 shows a state wherein the plurality of microlens arrays 2 is arrayed, and an image of a mask pattern in the mask 3 is projected onto the substrate using the microlens array 2. However, in FIG. 8, the microlens array 2 is shown using a longitudinal cross-sectional view, and the projection image is shown using a planar view. For example, 41 microlens arrays 2 (for convenience sake, 11 are shown in the drawing) are juxtaposed in the support substrate 6, and, for example, the microlens array 2 is 30 mm wide, and the support substrate 6 and the transparent substrate 3a of the mask 3 are 1220 mm wide.

Figure 9:
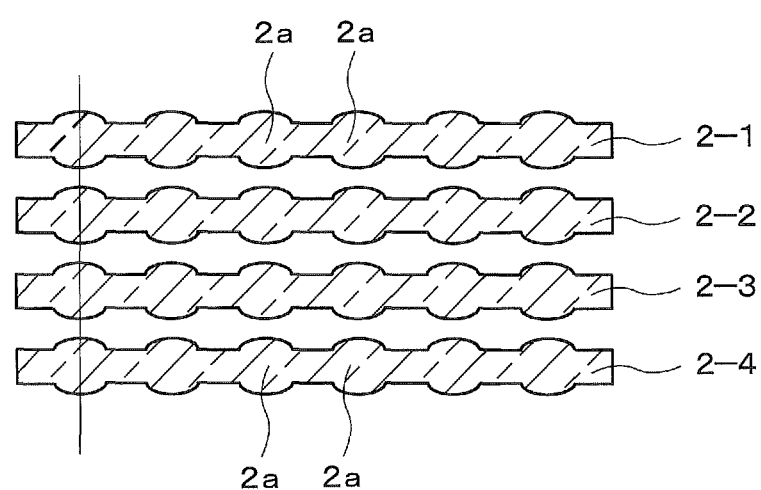
FIG. 9 is a schematic view showing an arrangement of the unit microlens array.
Figure 10:
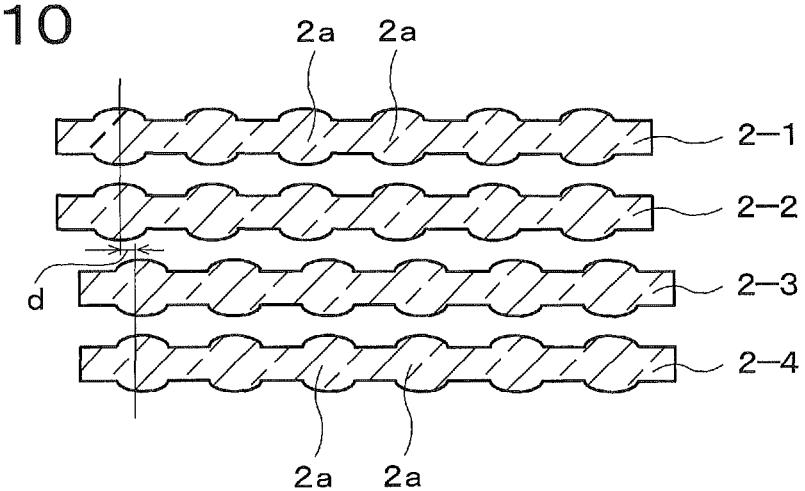
FIG. 10 is a schematic view showing a shift in the microlens optical axis of the unit microlens array.
Figure 11:
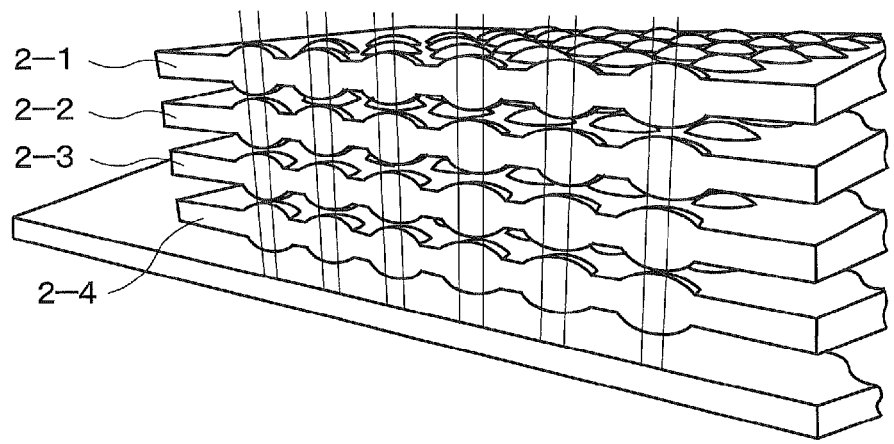
FIG. 11 a schematic perspective view (no shift) showing the arrangement of the unit microlens array.

FIG. 9 is a schematic view showing the stacked state of the unit microlens arrays 2-1, 2-2, 2-3, and 2-4. The configuration of the respective microlenses 2a in the four unit microlens arrays 2-1 and so forth comprises two convex lenses for each unit microlens array 2-1 as shown in FIG. 4. In a normal state, the optical axis of the microlenses 2a in the unit microlens arrays 2-1, 2-2, 2-3, and 2-4 all match as shown in FIG. 9. Therefore, the exposure light is irradiated perpendicularly onto the substrate as shown in FIG. 11.

Figure 12:
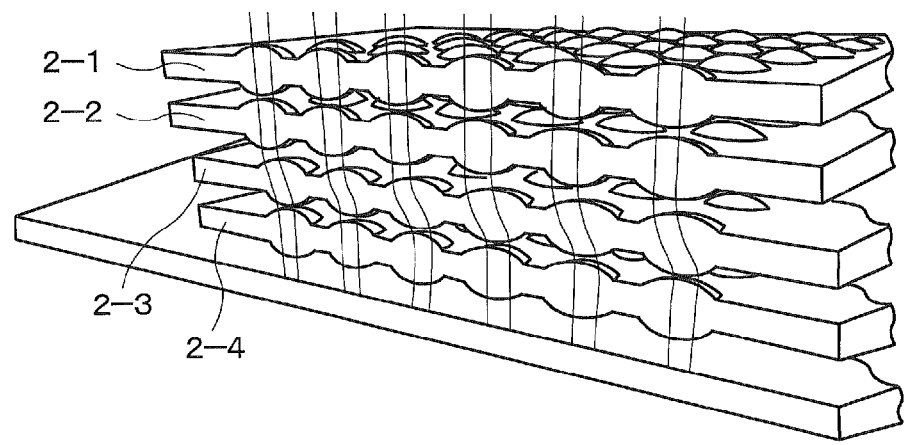
FIG. 12 a schematic perspective view (shifted) showing the arrangement of the unit microlens array.

However, in this embodiment, the optical axis of the first-layer unit microlens array 2-1 and the second-layer unit microlens array 2-2, and the optical axis of the third-layer unit microlens array 2-3 and the fourth-layer unit microlens array 2-4 can be made to shift by a distance of d. This shift d is, for example, 0.3 µm. Thus, the optical axis of the unit microlens arrays 2-3 and 2-4 shifts, thereby bending the exposure light between unit microlens array 2-2 and unit microlens array 2-3 as shown in FIG. 12, and the exposure light irradiates on the substrate at a position that deviates slightly from that in FIG. 11. The optical axis of the exposure light exiting the lowest layer fourth unit microlens array 2-4 shifts by 2d, or roughly two times the shift d in the optical axis of the third-layer unit microlens array 2-3, resulting in the shift of the exposure light on the substrate becoming approximately 2d. That is, when the optical axis of the microlens is shifted by d, the projection pattern shifts by approximately 2d on the substrate, and in a case where d=0.3 µm as described hereinabove, the projection pattern on the substrate shifts by 0.6 µm.

In so doing, it is possible to adjust the exposure position on the substrate using the microlens array by shifting the optical axis of the microlenses 2a in the unit microlens arrays 2-1 and so forth.

The shift in the microlens optical axis may move a portion of the unit microlens arrays in a direction perpendicular to the optical axis of the other microlens arrays. The movement of the microlens arrays, for example, may be carried out by applying a voltage to a piezo-electric element, thereby pushing the unit microlens array in the direction perpendicular to the optical axis by the amount by which the piezo-electric element is distorted by the change in voltage. In this case, the piezo-electric element constitutes the movement member, but the movement member is not limited to the piezo-electric element; various devices or members can be used.

Figure 13:
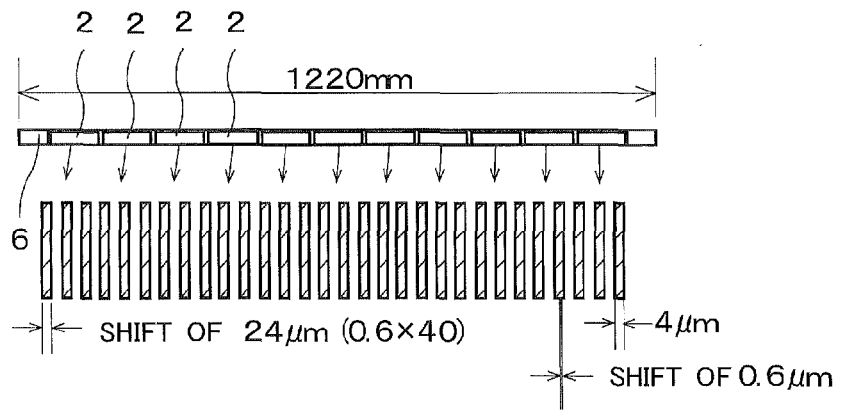
FIG. 13 is a schematic view showing an exposure light projection state using the plurality of microlens arrays.

In accordance with the shift in the optical axis of the microlens 2a by moving the unit microlens arrays 2-1 and so forth of the microlens array 2, it is possible, for example, to offset the exposure position by 0.6 µm using one microlens array 2. Therefore, as shown in FIG. 13, for example, in a case where the exposure position using the 41 juxtaposed microlens arrays 2 has been offset 0.6 µm with respect to one microlens array 2, it is possible to offset the projection position by 24.4 µm overall. That is, in a case where it is supposed that the exposure position of the microlens array 2 on the right end in FIG. 13 is the same as the case in FIG. 8, the exposure position of the right-end microlens array 2 in FIG. 13 moves to the left by 24.4 µm more than the case in FIG. 8, and the projection area of the projection pattern increases by 24.4 µm overall. Because the mask width is 1220 mm, this increase becomes $24.4 \times 10^{-3}$ (mm)/1220 (mm)=$20 \times 10^{-6}$, enabling a correction in the magnification of 20 ppm.

Furthermore, the adjustment of the exposure position can be performed in the same manner when reducing the magnification as well. In the above-described embodiment, the adjustment of the exposure position is performed by shifting the optical axis of the microlenses 2a between the first- and second-layer unit microlens arrays 2-1, 2-2 and the third- and fourth-layer unit microlens arrays 2-3, 2-4, but adjustment is for offsetting the optical axis of the microlenses in the unit microlens arrays at an inverted imaging position of the microlens array. Thus, the number of unit microlens arrays in the microlens array 2 is not limited to four as in the above-described embodiment, but in this case as well, the shift of the optical axis of the microlens in the unit microlens array must be performed at the inverted imaging position of the microlens array.

Figure 14:
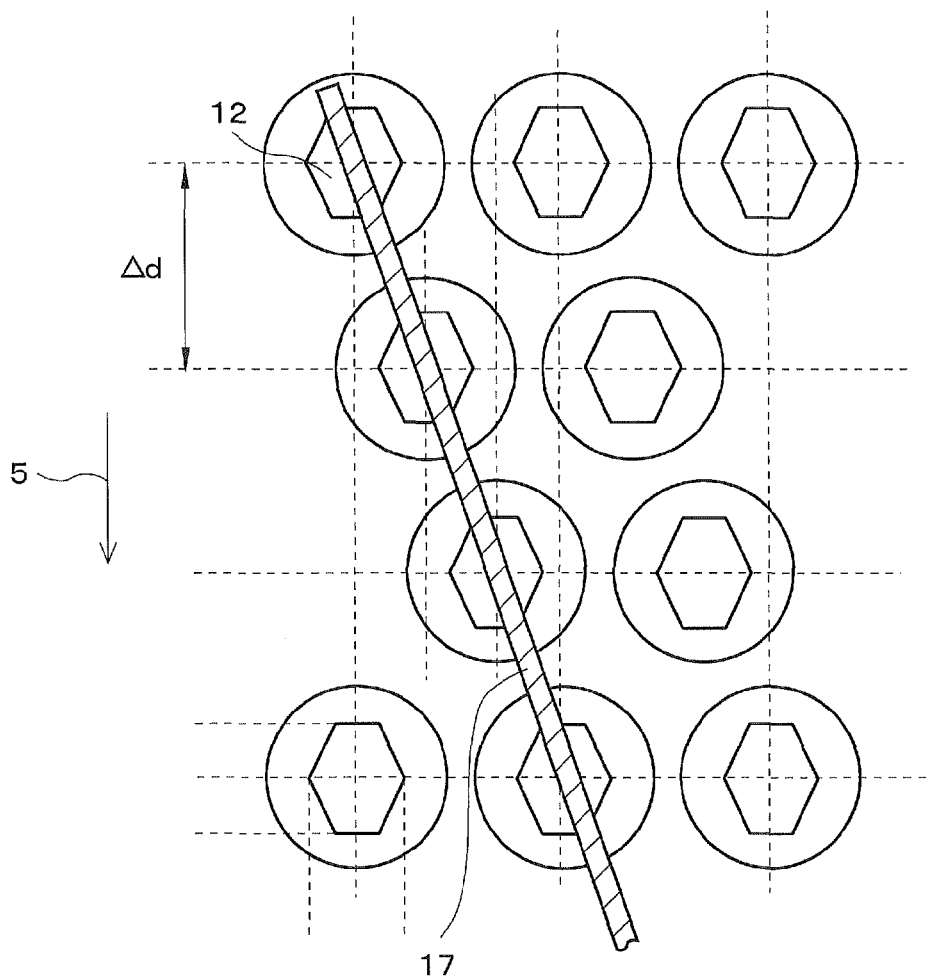
FIG. 14 is a planar view showing a method for detecting an exposure image using a CCD camera.

Next, a method for detecting an image of a reference pattern on the substrate using the camera 23 of FIG. 1 will be explained. The camera 23 is a CCD line camera, and detects an image linearly in one dimension. FIG. 14 is a drawing showing the arrangement of the microlenses 2a of the microlens array 2, and a detection area 17 of the CCD line camera 23. The hexagonal field stops 12 of the microlenses 2a that are the closest in relation to the scanning direction 5 are not parallel to the scanning direction 5, but rather are slanted as was described hereinabove. The linear detection area 17 of the CCD line camera is arranged slantingly relative to the scanning direction 5 so that the detection area 17 coincides with a straight line from the hexagonal field stop 12 of the microlens 2a in the corner part connecting the hexagonal field stops 12 of the microlenses 2a that are the closest in relation to the scanning direction 5.

When the CCD line camera 23 detects an image on the substrate 1 while the substrate 1 is being moved in the scanning direction 5, the image is detected along the line of the detection area 17 using a single line scan. The detection signal thereof is inputted to the image processor 24 and subjected to image processing. The detection area 17 of the CCD line camera 23, for example, is from the microlens 2a in the corner part of the microlens array 2 to the other end of the microlens array 2 in the width direction. That is, an image of the hexagonal field stops 12 of the microlenses 2a positioned on a tilted line is detected over an entire area in the width direction of the microlens array 2 from the corner part on the one end to the other end in relation to a direction perpendicular to the scanning direction 5. It is supposed that the scanning performance of the CCD line camera at this time is 10 msec per scan, and since the substrate and mask are moving at a rate of, for example, 100 mm/sec, the substrate and mask move 1 mm during the 10 msec scanning time. Therefore, when, subsequent to the CCD line camera 23 at the one end having detected an image of the microlens 2a in the corner part of the microlens array 2, the CCD line camera 23 at the other end has detected an image of the microlens 2a at the other end of the microlens array 2 in the width direction, the image of the microlens 2a at the other end is an image of a position 1 mm rearward of the position of the image of the microlens 2a in the corner part. For example, since the size of the substrate and the mask is 1 m in the width direction, a deviation of 1 mm occurs per meter of substrate. Consequently, a detection image deviation occurs between the adjacent microlenses 2a in the scanning direction proportional [to the quotient obtained] by dividing this 1 mm by the number of microlenses 2a.

Regarding the image scanned using the CCD line camera 23, after detecting the image of the microlens 2a in the corner part, the CCD line camera 23 detects the image of the diagonally forward microlens 2a in the substrate scanning direction 5. Thus, the images of the microlenses 2a arranged diagonally forward relative to the substrate scanning direction 5 are sequentially read into the one-dimensional scanned image of the CCD line camera 23. Therefore, when the microlens 2a array pitch in the substrate scanning direction 5 is Δd, the image signals read in by a single scan by the CCD line camera 23 constitute sequentially read-in images of microlenses 2a forwardly staggered by Δd in the substrate scanning direction 5. Consequently, in a case where this lens pitch Δd is 150 μm, then, when the substrate rate of movement is 100 mm/sec as was described hereinabove, it takes 1.5 msec to move the substrate the distance of the lens pitch Δd (=150 μm=0.15 mm). Therefore, when, subsequent to having detected the image of the microlens 2a in the corner part, the CCD line camera 23 detects the image of the next microlens 2a using a single scan, this next image is the image of a position forward in the substrate scanning direction 5 by Δd more than the image of the position adjacent to the image of the microlens 2a in the corner part in the direction perpendicular to the scanning direction. Consequently, an image of the position adjacent to the image of the microlens 2a in the corner part in the direction perpendicular to the scanning direction at a certain point in time is the image detected for this second microlens 2a 1.5 msec later than the point in time at which the image of the microlens 2a subsequent to the microlens 2a in the corner part would have been acquired at this point in time.

Figure 15:
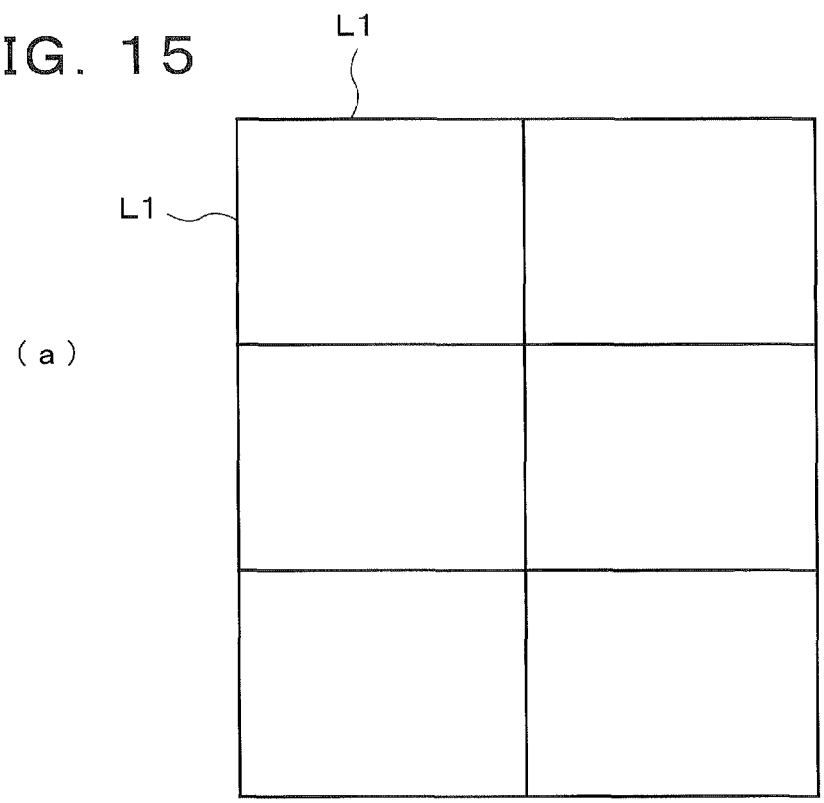
FIGS. 15(a) and 15(b) are views showing exposure patterns.
Figure 15:
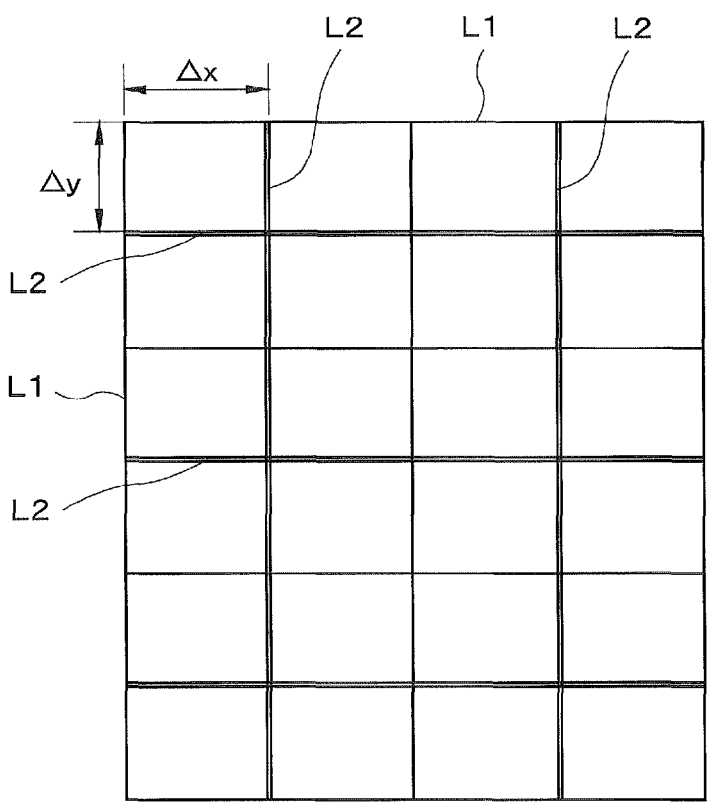

When the image processor 24 performs processing for correcting an image in relation to the above two points, i.e. time delay and position adjustment, on the basis of the signal acquired by the CCD line camera 23, an image of a certain prescribed point in time can be obtained while the substrate is being moved. For example, in a case where a first-layer exposure pattern L1 (reference pattern) as shown in FIG. 15(a) is formed on a substrate 1 conveyed to the exposure apparatus of this embodiment, the exposure apparatus scans the stopped substrate 1 at a prescribed position and uses the CCD line camera 23 to detect an image on the substrate 1. When the image processor 24 subjects the detection signal of this reference pattern L1 to image processing, the reference pattern L1 detection image shown in FIG. 15(a) is obtained. The controller 25, on the basis of the image detection signal of this image-processed pattern L1, calculates a deviation between a reference position in the first-layer pattern L1 and a reference position in an exposure pattern L2 formed on the mask 3 and to be subjected to exposure as a second-layer pattern L2, and calculates an adjustment (an amount of exposure correction) for the exposure position of the microlens array 2 for resolving this deviation. Then, the controller 25 outputs a signal corresponding to the amount of exposure correction of the microlens array 2 to the actuator 20 serving as the movement member for moving the unit microlens arrays 2-1 and so forth of the microlens array 2, and the actuator 20 (movement member) adjusts (shiftingly drives) the optical axis of the microlens in the microlens array 2 on the basis of this signal, thereby adjusting the exposure position on the substrate using the microlens array and adjusting the pseudo-magnification of the exposure light on the substrate.

Next, the operation of the exposure apparatus of this embodiment configured as described hereinabove will be described. First, as shown in FIG. 1, a substrate 1 is conveyed to a prescribed exposure position of the exposure apparatus. A pattern L1 such as shown in FIG. 15(a) is subjected to exposure on the substrate 1 as a reference pattern. The reference pattern L1 is a first-layer pattern, and using this first-layer pattern as a reference, a second-layer pattern through a fourth-layer pattern are subjected to exposure, and, for example, five layers of patterns are subjected to overlay exposure in the exposure apparatus.

In a case in which a change in dimensions occurs in the fabrication process for a thin-film transistor liquid-crystal substrate and a color filter or other such glass substrate at this time, the exposure pattern will deviate relative to the lower layer pattern in an overlay exposure. Accordingly, scanning is performed with respect to the conveyed substrate 1, the mask 3 therefor, and the microlens array 2, and an image on the substrate 1 is detected using the CCD line camera 23. The light detector of the CCD line camera 23 is a one-dimensional sensor, and as shown in FIG. 14, is installed so as to detect an area that is tilted relative to the substrate scanning direction 5. Thus, the detection area 17 of the CCD line camera 23 is not in a direction perpendicular to the substrate scanning direction 5, but rather is in a direction that is tilted relative to this direction. The reason for this is that, hypothetically, in a case in which a linear detection area 17 is arranged in the direction perpendicular to the substrate scanning direction 5, discrete portions will exist between the hexagonal field stops 12 of adjacent microlenses 2a, thereby making it impossible to detect an image on the substrate 1 in a continuous manner. Accordingly, in this embodiment, the detection area 17 is arranged in a tilting manner to pass through the hexagonal field stops 12 of adjacent microlens arrays 2 closest to the scanning direction 5. This makes it possible to detect an image on the substrate 1 having as a reference the detection image of the microlens 2a in the corner part, which constitutes the reference for the microarray 2a, by using image processing to perform a correction based on a delay time resulting from arranging the detection area 17 in a tilting manner, and a correction resulting from the time delay of the time for one scan by the CCD sensor. That is, the image processor 24 finds the first-layer pattern L1 on the substrate 1 shown in FIG. 15(a) on the basis of the camera 23 detection signal.

In a case in which the first-layer pattern L1 matches a second-layer pattern L2 that has been formed in the mask 3 and is to be subjected to exposure hereinafter, the controller 25 exposes this second-layer pattern L2 on the substrate. That is, the substrate 1 and the mask 3 are integrally moved relative to the microlens array 2 and the light source, and the exposure pattern L2 formed in the mask 3 is subjected to overlay exposure on top of the first-layer pattern L1. This makes it possible to form the second-layer pattern L2 in a position that is isolated from the corner part, which constitutes the reference for the first-layer pattern L1, to the extent of the design values Δx and Δy as shown in FIG. 15(b).

When the exposure light from the exposure light source is incident on the microlens array 2 by way of the mask 3 at this time as shown in FIG. 4, an inverted actual-size image is imaged in the hexagonal field stop 12. The exposure light transmitted through each microlens 2a using the hexagonal field stop 12 is formed into a hexagon as shown in FIG. 5(a), and projected onto the substrate 1 as an erect actual-size image. An exposure area is arranged on the substrate at this time using the microlens 2a as shown in FIG. 6.

Then, in the mode shown in FIG. 3, the entire exposure area of the substrate 1 in the direction perpendicular to the scanning direction 5 is subjected to exposure at uniform intensity using eight microlens arrays 2. Then, when the substrate 1 and the mask 3 are scanned in the scanning direction 5 relative to the microlens array 2, the exposure area of the entire surface of the substrate 1 is subjected to exposure at uniform intensity. This [allows] the mask pattern formed in the mask 3 to be imaged on the substrate 1.

Alternatively, in a case in which the position of the exposure pattern L2 at the current position of the mask 3 has deviated relative to the first-layer pattern L1 detected by the CCD line camera 23, the actuator 20, on the basis of the amount of shift in the optical axis of the microlens 2a calculated by the controller 25, moves the unit microlens arrays 2-3, 2-4 relative to the unit microlens arrays 2-1, 2-2 to adjust the irradiation position of the exposure light on the substrate 1 so that the reference position of the exposure pattern L2 in the mask 3 matches the reference position of the first-layer pattern L1. For example, when the respective optical axes of the microlenses 2a in the 41 (11 in the example shown in the drawing) microlens arrays 2 lined up in the direction perpendicular to the substrate scanning direction are shifted as shown in FIG. 13, the exposure position on the substrate 1 is adjusted using all of the microlens arrays 2, and the magnification is artificially adjusted.

In accordance with this, the reference pattern on the substrate and the exposure pattern projected using the plurality of microlens arrays 2 can be made to match with high precision by using the plurality of microlens arrays 2 to adjust the exposure position. That is, it is possible to resolve the deviation between the first-layer pattern L1 and the second-layer pattern L2.

In this embodiment, even when a change occurs in the dimensions of the substrate in an overlay exposure, this [change] can be detected in real-time, and the exposure position thereof can be adjusted to the lower layer exposure pattern with precision high degree of accuracy. That is, in this embodiment, a misregistration between a lower layer pattern and the exposure pattern during exposure in the exposure apparatus can be corrected by adjusting the position of the optical axis of the microlenses in accordance with moving the unit microlens arrays in the microlens array, making it possible to correct the misregistration in real-time and to perform overlay exposure with a high degree of accuracy.

Moreover, in the present invention, since the microlens 2a optical axis is shifted, thereby not only adjusting the exposure position on the substrate, but also adjusting the exposure pattern magnification, there is no fluctuation in the depth of focus of the exposure light with respect to the microlens arrays. That is, the surface of the substrate to be subjected to exposure can be positioned within the range of the depth of focus of all the microlenses. The depth of focus of the microlens array is normally 50 μm, and the exposure surface of the substrate can be positioned within this depth of focus.

Various types of light, such as pulsed laser radiation or a mercury lamp or other such continuous light can be used as the exposure light. In addition, this embodiment uses a CCD line camera 23 comprising a light irradiation unit for irradiating a light onto the substrate, and a CCD line sensor for detecting a reflected light, and uses a dichroic mirror 22 to irradiate an observation light from the camera 23 onto the substrate, but a light may be irradiated from below the substrate and the first-layer exposure pattern formed on the substrate may be detected by inputting the image thereof into the CCD line sensor. In addition, the detection of an image on the substrate is not limited to a case that uses a CCD line sensor; an image on the substrate can also be detected using a two-dimensional sensor.

It shall be apparent that the present invention is not limited to the embodiment described hereinabove. For example, in the above-described embodiment, as shown in FIG. 14, image processing is performed by arranging the line sensor of the CCD line camera 23 so that the detection area 17 thereof is tilted relative to the scanning direction 5, thereby detecting the images inside the contiguous hexagonal field stops 12 without interruption over an entire area in the direction perpendicular to the scanning direction 5. However, the images inside contiguous hexagonal field stops 12 can similarly be detected without interruption over an entire area in the direction perpendicular to the scanning direction 5 by arranging the line sensor in the direction perpendicular to the scanning direction 5 and providing three rows of these line sensors.

INDUSTRIAL APPLICABILITY

In the exposure apparatus using a microlens array of the present invention, it is possible to adjust an exposure position using the microlens array. In the present invention, even when a deviation of the exposure pattern from the reference pattern occurs, the deviation can be detected during exposure, and an exposure pattern misregistration can be prevented, thereby making it possible to enhance the accuracy of an exposure pattern in an overlay exposure. In addition, a microlens array is used to project erect an actual-size image of a mask exposure pattern onto a substrate, making it possible to adjust the magnification of the projection image on the substrate. Accordingly, the present invention is beneficial for expanding the applications of scanning exposure apparatuses that make use of microlens arrays.

KEY

1: Substrate
2: Microlens array
2a: Microlens
2-1, 2-2, 2-3, 2-4: Unit microlens arrays
3: Mask
3a: Transparent substrate
3b: Cr film
4: Exposure light source
5: Scanning direction
6: Support substrate
11: Aperture stop
12: Hexagonal field stop
12a: Rectangular portion
12b, 12c: Triangular portions
17: Detection area
20: Actuator
21: Optical system 22: Dichroic mirror
23: CCD line camera
24: Image processor
25: controller

What is claimed is:

1. A scanning exposure apparatus using a microlens array, comprising:
   a microlens array being arranged above a substrate to be subjected to exposure and having a plurality of unit microlens arrays arranged by being stacked on top of one another, the unit microlens arrays configured having each of a plurality of microlenses arranged two-dimensionally therein;
   a mask arranged above the microlens arrays and having a prescribed exposure pattern formed thereon;
   an exposure light source for irradiating an exposure light on the mask; and
   a movement member for moving at least a portion of the unit microlens arrays so that the optical axis of the component microlenses thereof is shifted relative to the other unit microlens arrays,
   wherein the exposure position on the substrate is adjusted using the microlens array by shifting the optical axis between the unit microlens arrays, and
   wherein the microlens array is configured from four unit microlens arrays, and is configured to shift the microlens optical axis between the unit microlens arrays of a first layer and a second layer, and the unit microlens arrays of a third layer and a fourth layer.

2. A scanning exposure apparatus using a microlens array according to claim 1, wherein a plurality of said microlens arrays is arranged along the surface of said substrate;
   said exposure apparatus further comprises:
   an image detector for detecting said substrate image;
   an image processor for performing image processing on the basis of the image detection signal to obtain a reference pattern formed on the substrate; and
   a controller for calculating a deviation between the reference pattern and an exposure pattern for said mask that is to be subjected to exposure, and adjusting, by way of said movement member, the position of the microlens optical axis in each of said microlens arrays to resolve the deviation between said reference pattern and said exposure pattern; and
   said plurality of microlens arrays is used to adjust the exposure position on the substrate to make the exposure pattern match said reference pattern.

3. A scanning exposure apparatus using a microlens array, comprising:
   a microlens array being arranged above a substrate to be subjected to exposure and having a plurality of unit microlens arrays arranged by being stacked on top of one another, the unit microlens arrays configured having each of a plurality of microlenses arranged two- dimensionally therein;
   a mask arranged above the microlens arrays and having a prescribed exposure pattern formed thereon;
   an exposure light source for irradiating an exposure light on the mask; and
   a movement member for moving at least a portion of the unit microlens arrays so that the optical axis of the component microlenses thereof is shifted relative to the other unit microlens arrays,
   wherein the exposure position on the substrate is adjusted using the microlens array by shifting the optical axis between the unit microlens arrays, and
   wherein the microlens array is configured from a plurality of unit microlens arrays, and is configured so that the respective microlens' optical axes are shifted at a prescribed inverted imaging position between the stacked unit microlens arrays.

4. A scanning exposure apparatus using a microlens array according to claim 3, wherein a plurality of said microlens arrays is arranged along the surface of said substrate;
   said exposure apparatus further comprises:
   an image detector for detecting said substrate image;
   an image processor for performing image processing on the basis of the image detection signal to obtain a reference pattern formed on the substrate; and
   a controller for calculating a deviation between the reference pattern and an exposure pattern for said mask that is to be subjected to exposure, and adjusting, by way of said movement member, the position of the microlens optical axis in each of said microlens arrays to resolve the deviation between said reference pattern and said exposure pattern; and
   said plurality of microlens arrays is used to adjust the exposure position on the substrate to make the exposure pattern match said reference pattern.

5. A scanning exposure apparatus using a microlens array, comprising:
   a microlens array being arranged above a substrate to be subjected to exposure and having a plurality of unit microlens arrays arranged by being stacked on top of one another, the unit microlens arrays configured having each of a plurality of microlenses arranged two- dimensionally therein;
   a mask arranged above the microlens arrays and having a prescribed exposure pattern formed thereon;
   an exposure light source for irradiating an exposure light on the mask; and
   a movement member for moving at least a portion of the unit microlens arrays so that the optical axis of the component microlenses thereof is shifted relative to the other unit microlens arrays,
   wherein the exposure position on the substrate is adjusted using the microlens array by shifting the optical axis between the unit microlens arrays, and
   wherein a plurality of said microlens arrays is arranged along the surface of said substrate;
   said exposure apparatus further comprises:
   an image detector for detecting said substrate image;
   an image processor for performing image processing on the basis of the image detection signal to obtain a reference pattern formed on the substrate; and
   a controller for calculating a deviation between the reference pattern and an exposure pattern for said mask that is to be subjected to exposure, and adjusting, by way of said movement member, the position of the microlens optical axis in each of said microlens arrays to resolve the deviation between said reference pattern and said exposure pattern; and
   said plurality of microlens arrays is used to adjust the exposure position on the substrate to make the exposure pattern match said reference pattern.

* * * * *